(12) United States Patent
Lin et al.

(10) Patent No.: US 10,908,435 B2
(45) Date of Patent: Feb. 2, 2021

(54) AUTOMATICALLY PHOTOSENSITIVE SUNGLASSES WITH LOW POWER CONSUMPTION

(71) Applicant: Jiangmen Yeebo Semiconductor Co., Ltd., Jiangmen (CN)

(72) Inventors: Guoqi Lin, Jiangmen (CN); Lieyin Lin, Jiangmen (CN); Huili Han, Jiangmen (CN); Genghao Wu, Jiangmen (CN)

(73) Assignee: JIANGMEN YEEBO SEMICONDUCTOR CO., LTD., Guangdong (CN)

( * ) Notice: Subject to any disclaimer, the term of this patent is extended or adjusted under 35 U.S.C. 154(b) by 0 days.

(21) Appl. No.: 16/607,194

(22) PCT Filed: Nov. 21, 2017

(86) PCT No.: PCT/CN2017/111986
§ 371 (c)(1),
(2) Date: Oct. 22, 2019

(87) PCT Pub. No.: WO2019/024333
PCT Pub. Date: Feb. 7, 2019

(65) Prior Publication Data
US 2020/0387011 A1 Dec. 10, 2020

(30) Foreign Application Priority Data

Aug. 2, 2017 (CN) .................... 2017 2 0961210 U (51) Int. Cl.
*G02C 7/10* (2006.01)
*G02F 1/133* (2006.01)
(Continued)

(52) U.S. Cl.
CPC ............. *G02C 7/101* (2013.01); *G02F 1/137* (2013.01); *G02F 1/13318* (2013.01); *H03K 17/6871* (2013.01); *G02F 2001/13312* (2013.01)

(58) Field of Classification Search
CPC ..... G02C 7/101; G02F 1/13318; G02F 1/137; G02F 2001/13312; H03K 17/6871
See application file for complete search history.

(56) References Cited

U.S. PATENT DOCUMENTS 4,968,127 A * 11/1990 Russell .................. A61F 9/023
351/158

FOREIGN PATENT DOCUMENTS

CN   201203720 Y    3/2009
CN   101592791 A   12/2009
(Continued)

OTHER PUBLICATIONS

International Search Report for PCT/CN2017/111986 dated Mar. 27, 2018.

*Primary Examiner* — Nathanael R Briggs
(74) *Attorney, Agent, or Firm* — . Schmeiser, Olsen & Watts, LLP (57) ABSTRACT

Provided is a pair of automatically photosensitive sunglasses with low power consumption, including a spectacle frame, two liquid crystal lenses provided thereon, a power supply module, a photosensor, a microprocessor, and a high-frequency charging and discharging bootstrap circuit, wherein the microprocessor comprises a low-frequency switching drive circuit for switching to a low or a high driving voltage of the liquid crystal lenses. The photosensor on the glasses triggers a switch by intelligently sensing the light change, and the lenses automatically become bright or dark accordingly, which is more convenient for users as it requires no manual operation. As the input power supply voltage is (Continued)

greatly increased by the high-frequency charging and discharging bootstrap circuit, simply a small and low voltage battery is enough to make it work.

10 Claims, 10 Drawing Sheets

(51) Int. Cl.
*H03K 17/687* (2006.01)
*G02F 1/137* (2006.01)

(56) References Cited

FOREIGN PATENT DOCUMENTS

| CN | 101592809 A | 12/2009 |
|----|-------------|---------|
| CN | 101592809 B | 11/2010 |
| CN | 203786419 U | 8/2014 |

\* cited by examiner

AUTOMATICALLY PHOTOSENSITIVE SUNGLASSES WITH LOW POWER CONSUMPTION

CROSS-REFERENCE TO RELATED APPLICATIONS

This application claims priority to PCT Application No. PCT/CN2017/111986, having a filing date of Nov. 21, 2017, which is based on Chinese Application No. 201720961210.6, having a filing date of Aug. 2, 2017, the entire contents both of which are hereby incorporated by reference.

FIELD OF TECHNOLOGY

The following relates to the field of sunglasses, and more particularly to a pair of automatically photosensitive sunglasses with low power consumption.

BACKGROUND

Wearing sunglasses is one of the most common measures to protect eyes from being injured caused by strong light stimulation. Currently, commercially available sunglasses are usually full dark in color or with manual flip-up lenses, so that a better vision will only be obtained with the sunglasses removed or the lenses flipped up when people wearing these sunglasses move from a sunny place or where the light is bright to a place without sunshine or where the lighting is poor. Frequent operation of the sunglasses gives a rise to unnecessary trouble when the ambient light changes frequently.

The lens of a pair of automatically photosensitive sunglasses in the known art, which is made from liquid crystal, is automatically adjustable along with the change of the ambient light since the light transmittance of the lens can be varied by changing the voltage applied on the liquid crystal lens. At present, the automatically photosensitive sunglasses usually have large power consumption, high output voltage frequency, and bad appearance due to the USB interface arranged on the spectacle frame as it is usually in USB charging mode. The automatically photosensitive sunglasses in known art needs to be fully charged everytime before using it, and its battery life is too short to be used when required and thus these sunglasses are too difficult to use.

SUMMARY

An aspect relates to a pair of automatically photosensitive sunglasses with low power consumption to solve the above indicated problem.

Provided is a pair of automatically photosensitive sunglasses with low power consumption, comprising a spectacle frame, two liquid crystal lenses provided thereon, a power supply module, a photosensor for sensing the ambient luminosity, a microprocessor for adjusting the liquid crystal lenses between a bright condition and a dark condition, and a high-frequency charging and discharging bootstrap circuit for increasing the output voltage. The microprocessor comprises a voltage detecting circuit, the input port of which is connected to the photosensor in order to detect the voltage across the photosensor, a input control port connected to the photosensor, a power source port connected to the power supply module, a boost control port connected to the input port of the high-frequency charging and discharging bootstrap circuit, and a low-frequency switching drive circuit for switching to a low or high driving voltage of the liquid crystal lenses. The input port of the low-frequency switching drive circuit is connected with the output port of the high-frequency charging and discharging bootstrap circuit, and the output ports of the low-frequency switching drive circuit are connected to the two liquid crystal lenses respectively.

Further, the low-frequency switching drive circuit is installed internally in the microprocessor which further comprises an oscillating power circuit and a frequency reduction circuit. The oscillating power circuit provides a high-frequency charging signal to the high-frequency charging and discharging bootstrap circuit through the boost control port, and a low-frequency switching signal to the low-frequency switching drive circuit through the frequency reduction circuit. The charging frequency can be increased by the oscillating power circuit and a largely raised supply voltage is thereby achieved. By means of the frequency reduction circuit, the supply voltage can be largely decreased, and the frequency for flipping between a high level and a low level of the driving voltage is decreased, and a reduced power consumption is thereby achieved.

Further, the microprocessor further comprises a drive circuit of power supply for powering the interior of the microprocessor, wherein the power supply module connects to the power source port and supplies a DC current. The drive circuit comprises a pulse power circuit having a pulse power output port connected to the oscillating power circuit, and the pulse power circuit converts the DC current from the power supply module to a pulse power signal and output it through the pulse power output port. The pulse power signal generated by the pulse power is used for driving the interior devices within the microprocessor to work, and is outputted to the oscillating power circuit to provide a pulse oscillation-starting power signal, the oscillating power circuit utilizes the pulse power signal to generate a high-frequency charging signal for the high-frequency charging and discharging bootstrap circuit.

The pulse power circuit further comprises a biased current output port which is connected to the power supply port of the photosensor and used for providing supply voltage to the photosensor. The pulse power circuit also has a biased current port for powering external devices, for example, a photosensor. In this way, for those photosensors which require additional power supply, it can be powered by the microprocessor without any additional power supply, which contributes to simplify the circuit. Float the biased current output port if the utilized photosensor needs no additional power supply.

Further, a voltage generated by the photosensors is used as a voltage signal to be detected in the voltage detecting circuit which is connected with the pulse power circuit. The pulse power signal generated by the pulse power is used for driving the interior devices within the microprocessor to work. The pulse power signal together with the voltage signal from the voltage detecting circuit creates a delay control signal for a time-delay circuit as will be described hereafter.

The microprocessor further comprises a voltage detecting circuit for detecting the voltage across the photosensor, the input port of which is connected to the photosensor and the output is connected to the low-frequency switching drive circuit. The voltage detecting circuit detects the voltage outputted by the photosensor and if the detected voltage is higher than a predetermined threshold, the sunglasses will be regarded as in a strong light environment, then the voltage detecting circuit sends a switching signal to the low-frequency switching drive circuit and activate it;

whereas if the detected voltage is lower than a predetermined threshold, there is not any signals outputted from the voltage detecting circuit and the low-frequency switching drive circuit stops its output, and then the liquid crystal lenses return to normal status.

Further, the voltage detecting circuit is connected with the low-frequency switching drive circuit through a time-delay circuit, and the voltage detecting circuit further comprises a delay control capacitor arranged outside the microprocessor and connected to the time-delay circuit. The time-delay circuit and the delay control capacitor for controlling the delay time are configured such that the response of the low-frequency switching drive circuit is delayed, i.e. only strong light which lasts at least the delay-time will be identified to activate the switching in order to prevent the light transmittance of the liquid crystal lenses from reducing immediately when a sudden burst of strong light occurs and lead to a better user experience.

Further, the photosensor and the microprocessor are located at the nose pad of the spectacle frame and the power supply module is located at the nose pad or the legs of the spectacle frame. The design appearance of the sunglasses with this configuration is improved as it minimizes the unwanted impact of circuit elements on the appearance.

Specifically, the photosensor comprises two photosensitive diodes and a fixed resistor connected in parallel with the diodes. The photosensitivity can be improved by using two photosensitive diodes. By connecting the photosensitive diodes with the resistor, the optical signals can be converted into voltage signals directly and thereby activate the microprocessor.

Specifically, a 1.55 V button battery is used in the power supply module for power supply and the output voltage of the high-frequency charging and discharging bootstrap circuit is 4 times the battery voltage, namely 6.2 V. The battery has a low voltage and a very small current less than 50 nA. With the bootstrap circuit, a significantly raised driving voltage is obtained and a longer battery life is achieved.

Specifically, the high-frequency charging signal provided by the oscillating power circuit to the high-frequency charging and discharging bootstrap circuit is a square signal at a frequency of 185 hz.

The delay control capacitor creates an analog delay of 18 milliseconds per nano farad. An input bias current of 10 nA is supplied to the microprocessor which has an input impedance above 1000 MΩ.

Further, the low-frequency switching signal provided by the frequency reduction circuit to the low frequency switching drive circuit is a square signal at a frequency of 1/90 hz. The frequency of 1/90 hz indicates that the level is flipped every 90 seconds. It is in a low level status when there is no voltage applied on the liquid crystal lenses and thereby a low-power consumption is achieved.

Further, each of the liquid crystal lenses comprises an upper glass substrate and a lower glass substrate, and the electrodes of the upper glass substrate and the lower glass substrate are connected to an output port of the low-frequency switching drive circuit of the microprocessor.

The embodiments of the automatically photosensitive sunglasses with low power consumption according to embodiments of the present invention has the beneficial effects of becoming bright or dark accordingly by means of configuring a photosensor on the glasses to automatically trigger a switch by intelligently sensing the light change, which is more convenient for users as it requires no manual operation. As the input power supply voltage for the light sensing circuit is greatly increased by the high-frequency charging and discharging bootstrap circuit, simply a small and low voltage battery is enough to make it work. In addition, the frequency of the driving voltage of the liquid crystal lenses is greatly reduced due to the low-frequency switching drive circuit, thereby an effectively reduced power consumption of the glasses as well as a better power saving is achieved, and the life spans of the battery and the glasses are prolonged.

BRIEF DESCRIPTION

Some of the embodiments will be described in detail, with reference to the following figures, wherein like designations denote like members, wherein.

DETAILED DESCRIPTION

Referring to FIG. 1 to FIG. 4, a pair of automatically photosensitive sunglasses with low power consumption provided in embodiments of the present invention comprises a spectacle frame 10, two liquid crystal lenses 50 provided on the spectacle frame 10, a power supply module 20, a photosensor 30 for sensing the ambient luminosity, a microprocessor 40 for adjusting the liquid crystal lenses between a bright condition and a dark condition, a high-frequency charging and discharging bootstrap circuit 1 for increasing the output voltage. The microprocessor 40 comprises a input control port SEI connected to the photosensor 30, a power source port VDD connected to the power supply module 20, a boost control port DC+/DC− connected to the input port of the high-frequency charging and discharging bootstrap circuit 1, and a low frequency switching drive circuit 2 into a low driving voltage or a high driving voltage of the liquid crystal lenses, wherein the input port VLCD of the low-frequency switching drive circuit 2 is connected to the output port of the high-frequency charging and discharging bootstrap circuit 1, and the output ports LCDA+/LCDA− of the low-frequency switching drive circuit 2 are connected to the two liquid crystal lenses 50 respectively. The photosensor 30 on the glasses triggers a switch by intelligently sensing the light change, and the lenses automatically become bright or dark accordingly, which is more convenient for users as it requires no manual operation. As the input power supply voltage for the light sensing circuit is greatly increased by the high-frequency charging and discharging bootstrap circuit 1, simply a small and low voltage battery is enough to make it work. In addition, the frequency of the driving voltage of the liquid crystal lenses 50 is greatly reduced due to the low-frequency switching drive circuit 2, thereby an effectively reduced power consumption of the glasses as well as a better power saving is achieved, and the life spans of the battery and the glasses are prolonged.

Figure 1:
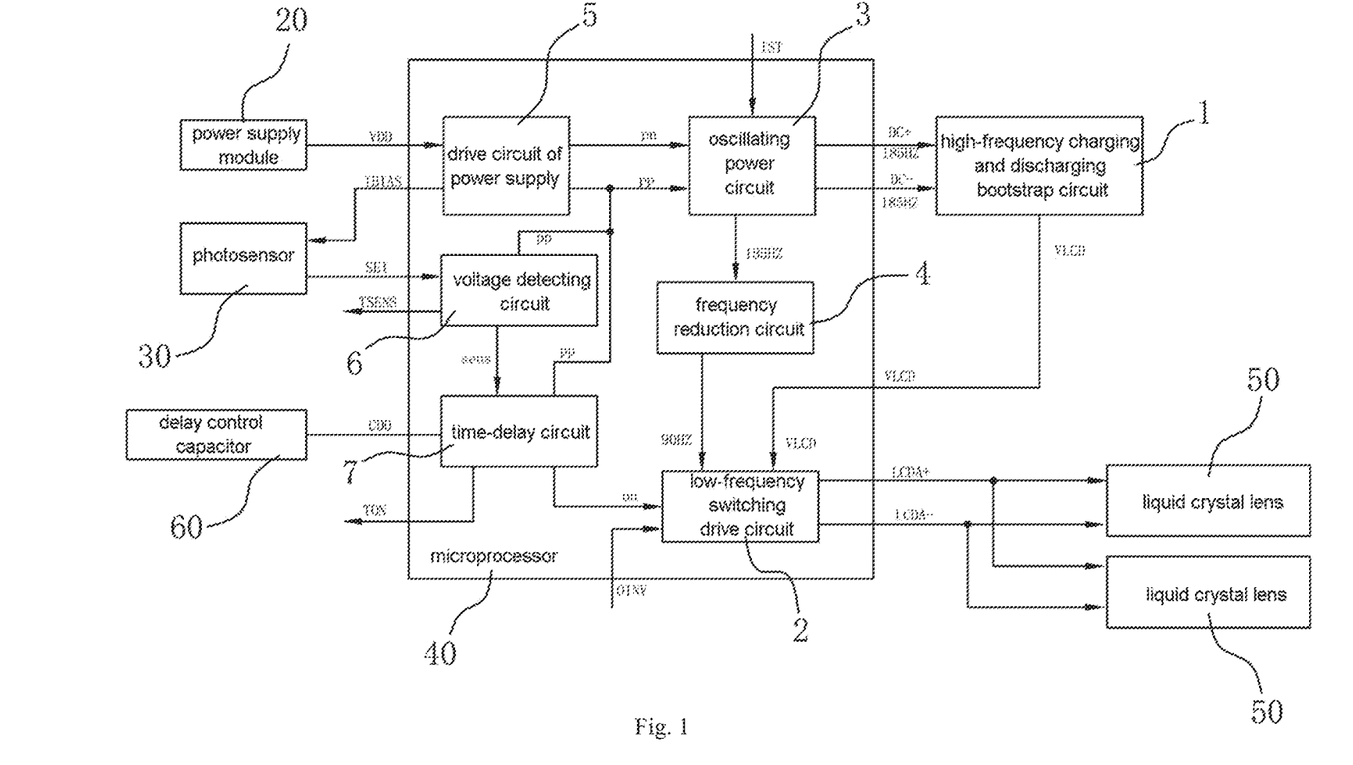
FIG. 1 illustrates a circuit schematic diagram of the automatically photosensitive sunglasses with low power consumption according to embodiments of the present invention.
Figure 5:
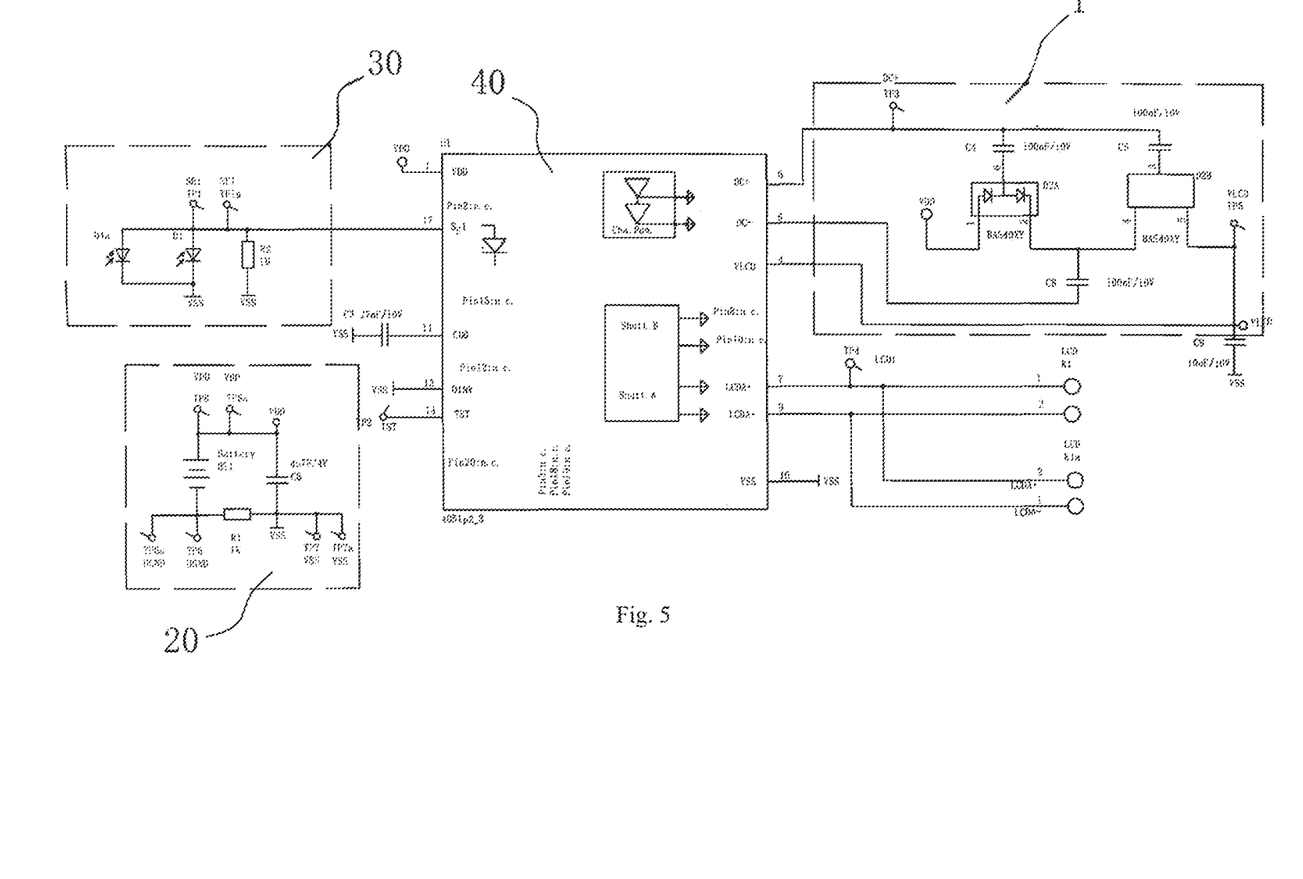
FIG. 5 illustrates a circuit schematic view according to embodiments of the present invention.

Referring to FIG. 1 and FIG. 5, the low-frequency switching drive circuit 2 is installed internally in the microprocessor 40 which further comprises an oscillating power circuit 3 and a frequency reduction circuit 4. The oscillating power circuit 3 provides a high-frequency charging signal to the high-frequency charging and discharging bootstrap circuit 1 through the boost control port, and a low-frequency switching signal to the low-frequency switching drive circuit 2 through the frequency reduction circuit 4. The charging frequency can be increased by means of the oscillating power circuit 3 and a largely raised supply voltage is thereby achieved. By means of the frequency reduction circuit 4, the supply voltage can be largely decreased, and the frequency for flipping between a high level and a low level of the driving voltage is decreased, and a reduced power consumption is thereby achieved.

As the sunglasses in embodiments of the present invention is of fairly low power consumption, simply a 1.55 V button battery is enough for powering the power supply module 20, and the output voltage VLCD of the high-frequency charging and discharging bootstrap circuit 1 is 4 times the battery voltage, namely 6.2 V. The button battery supplies a low voltage and it cost little, and a significantly raised driving voltage can be obtained by the bootstrap circuit, thus a longer battery life is achieved.

The oscillating power circuit 3 supplies a high-frequency charging signal at a frequency of 185 hz to the high-frequency charging and discharging bootstrap circuit 1, and the frequency reduction circuit 4 supplies a low-frequency switching signal which is a square signal at a frequency of 1/90 hz to the low-frequency switching drive circuit 2. The frequency of 1/90 hz indicates that the level flips every 90 seconds and a low power consumption is thereby achieved.

Figure 6:
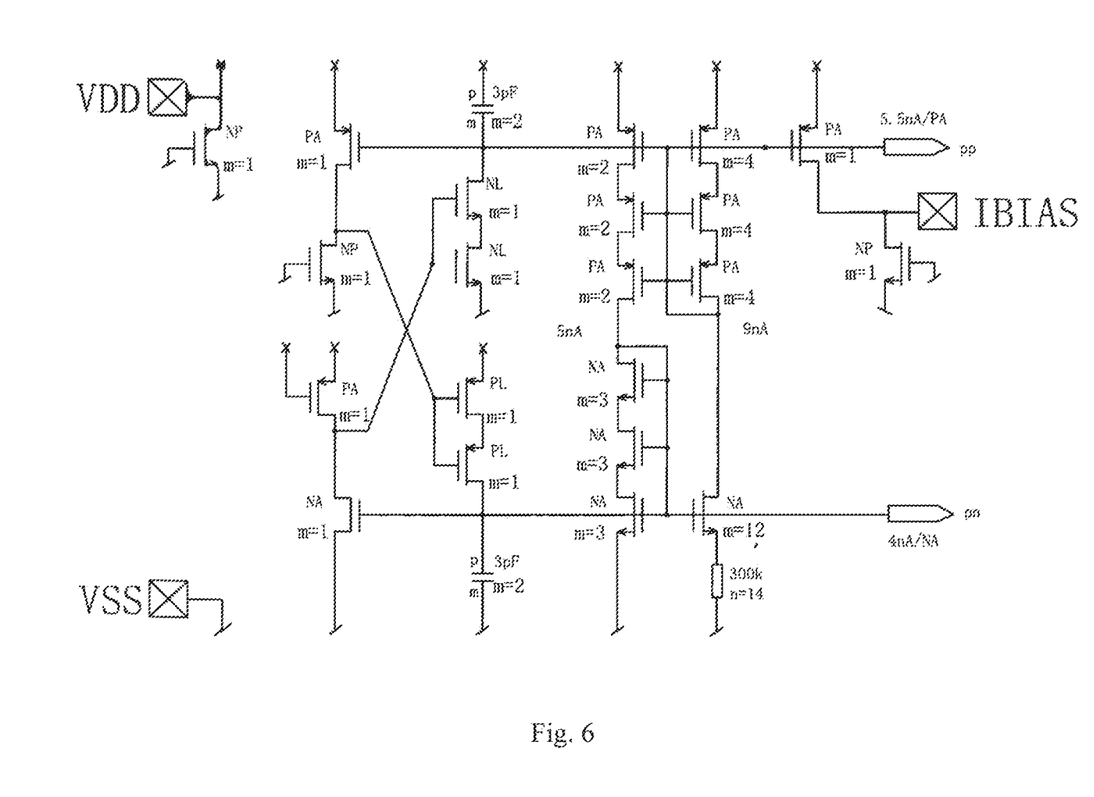
FIG. 6 illustrates a circuit schematic view of the power supply drive circuit according to embodiments of the present invention.

Specifically, referring to FIG. 1 and FIG. 6, the microprocessor 40 further comprises a drive circuit of power supply 5 for powering the interior devices within the microprocessor 40, wherein the drive circuit of power supply 5 comprises a pulse power circuit for generating a pulse power signal, the pulse power circuit has a DC voltage of 1.55 V by connecting to the button battery through the power supply port VDD, and then converts such DC voltage into pulse power signals and output them. The pulse power circuit supplies two pulse power signals, that is a pulse voltage-signal PP and a pulse voltage-signal Pn, which are outputted to the oscillating power circuit 3 for providing a pulse oscillation—starting power supply signal. The pulse voltage-signal PP also serves as the current source for both the voltage detecting circuit 6 and the time-delay circuit 7.

Figure 7:
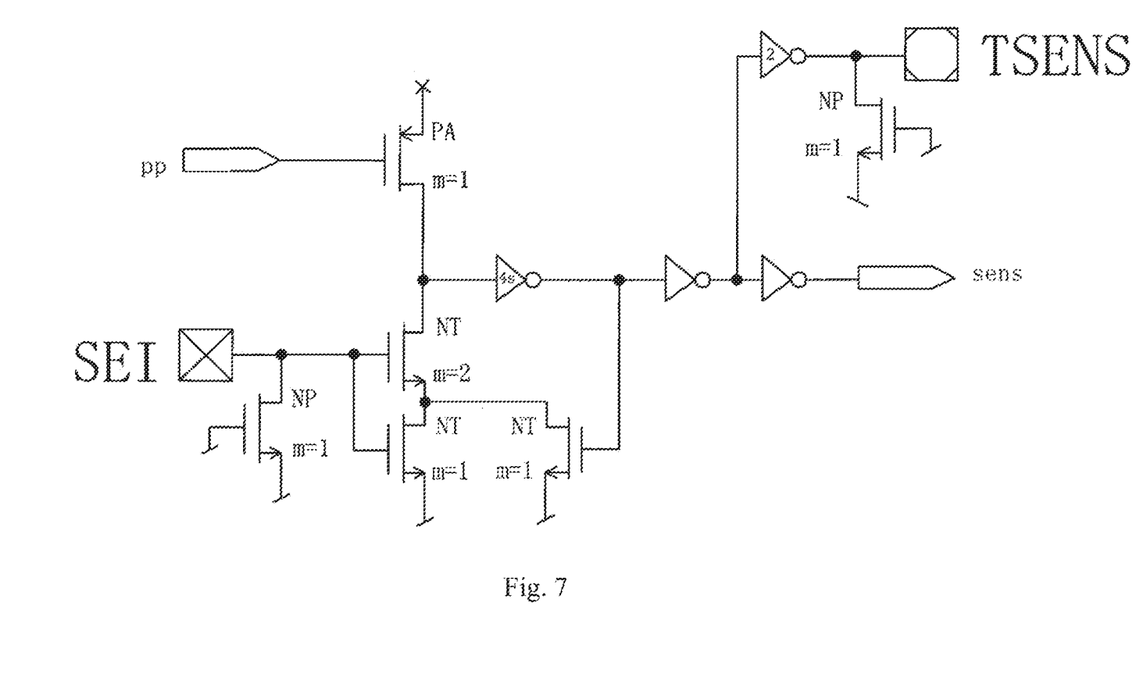
FIG. 7 illustrates a circuit schematic view of the voltage detecting circuit according to embodiments of the present invention.

With reference to FIGS. 1, 5, and 7, the microprocessor 40 further comprises a voltage detecting circuit 6 for detecting the voltage across the photosensor 30. The voltage detecting circuit 6 has an input port connected to the photosensor 30 and an output port connected to the low-frequency switching drive circuit. The photosensor 30 comprises two photosensitive diodes and a fixed resistor connected in parallel with the diodes. The photosensitivity can be improved by using two photosensitive diodes. By connecting the photosensitive diodes with the resistor, the optical signals can be converted directly into voltage signals, and outputted to the voltage detecting circuit 6 through the SEI pin of the microprocessor 40 subsequently. As illustrated in FIG. 7, the pulse voltage-signal PP provides a pulse driving power to the voltage detecting circuit 6, wherein when the voltage across the photosensor 30 is higher than 420 mV, the gate circuit is conducted and the output port sens of the voltage detecting circuit 6 output a control signal, and when the voltage across the photosensor 30 is less than 375 mV, the output port sens of the voltage detecting circuit 6 stop the output of the control signal. A TSENS port is further provided in the voltage detecting circuit 6 for detecting whether there is a control signal output.

In this embodiment, no any additional power supply is needed for the photosensor 30 to generate a sufficient detecting voltage. For those photosensors 30 which works normally only when additional power supply is provided, as illustrated in FIG. 6, the pulse power circuit further comprises a biased current output port IBIAS connected with the power supply port of the photosensor for providing supply voltage to the photosensor, so that no additional power supply circuit is needed, that is, the photosensor can be powered by the microprocessor 40, which contributes to simplify the circuit. Float the biased current output port IBIAS if the utilized photosensor 30 needs no additional power supply.

Figure 8:
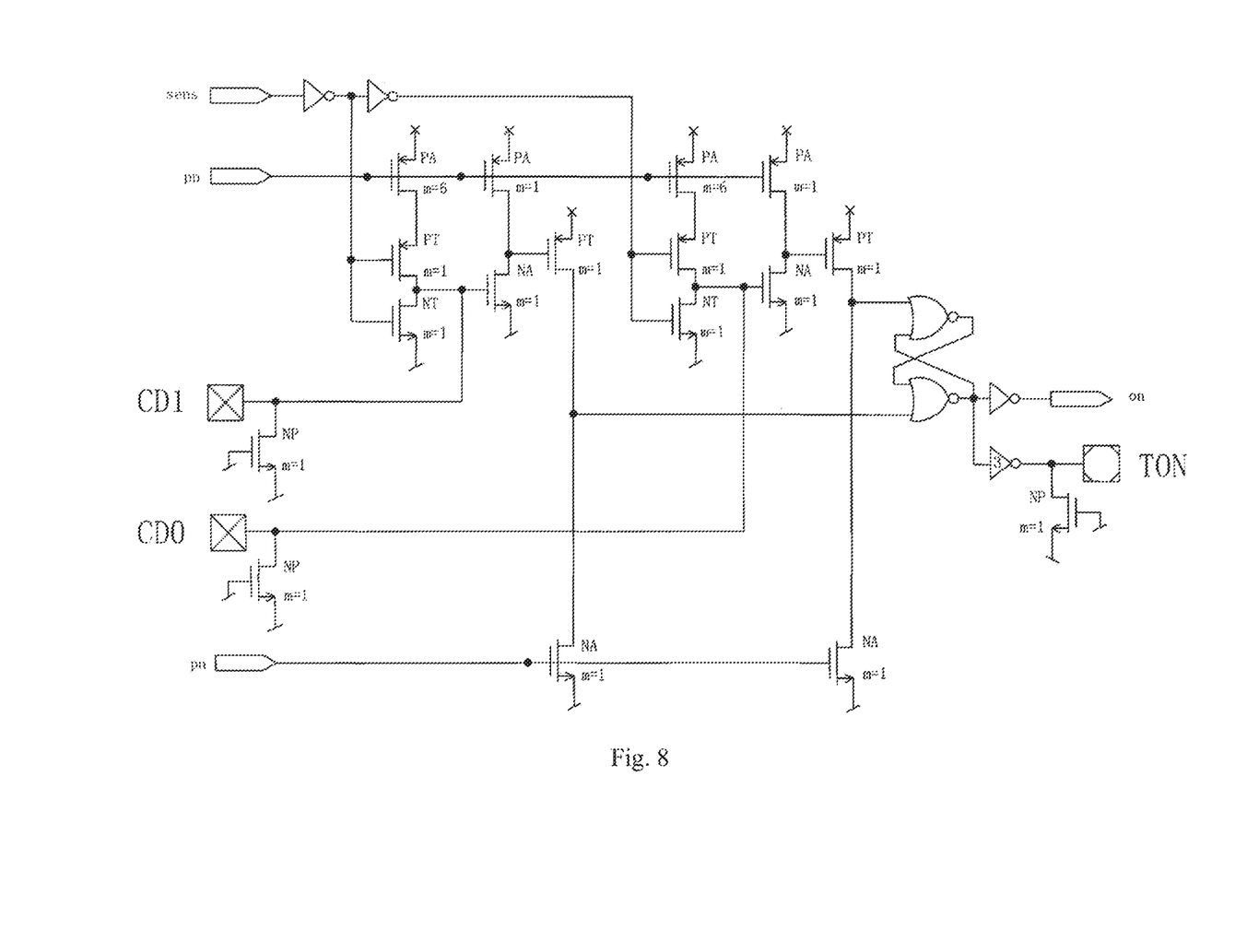
FIG. 8 illustrates a circuit schematic view of the time-delay circuit according to embodiments of the present invention.

With reference to FIG. 1 and FIG. 8, the microprocessor 40 further comprises a time-delay circuit 7, the pulse voltage-signal PP is served as a power source of the time-delay circuit 7. The time-delay circuit 7 has an input port connected with the output port sens of the voltage detecting circuit 6, and an output port on connected with the input port of the low-frequency switching drive circuit 2 to output a signal of the liquid crystal lenses to the low-frequency switching drive circuit 2. The delay time of the time-delay circuit 7 is controllable as the time-delay circuit 7 comprises a CDO port to control the delay time. A delay control capacitor 60 is connected to the CDO port, and creates an analog delay of 18 milliseconds per nano-farad. The time-delay circuit 7 further comprises a testing port TON which is connected in parallel with the output port on of the time-delay circuit 7 in order to give a test about whether the output of the time-delay circuit 7 is normal.

Figure 9:
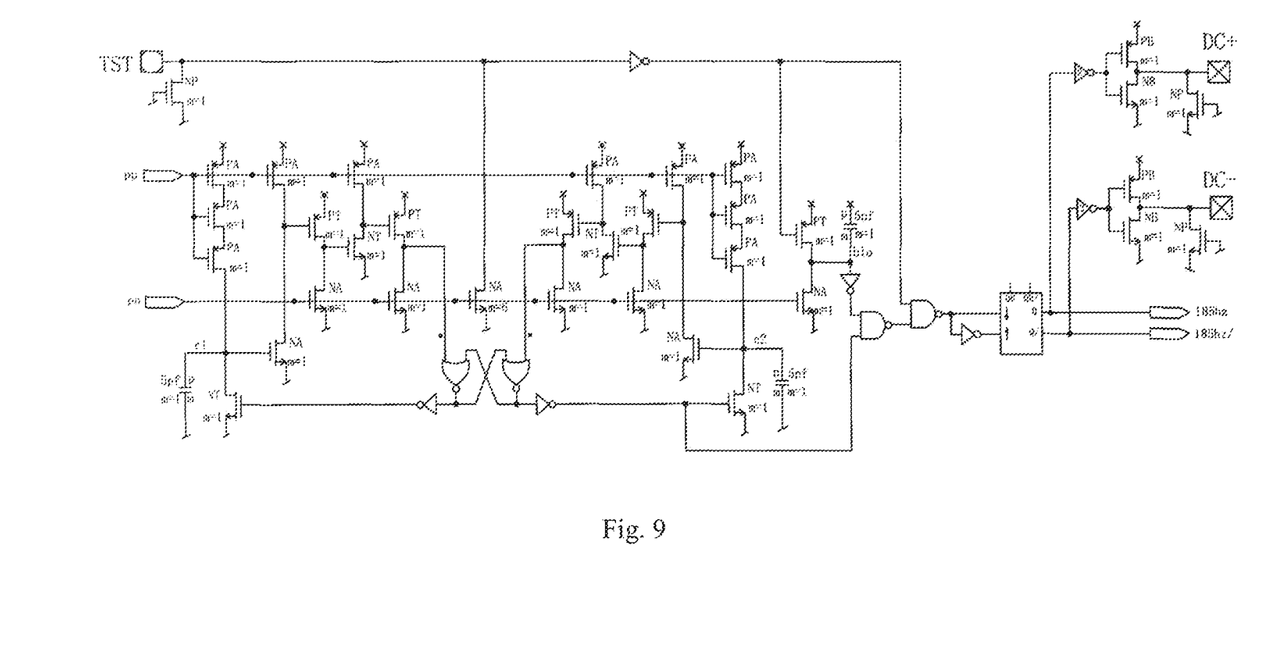
FIG. 9 illustrates a circuit schematic view of the oscillating power circuit according to embodiments of the present invention.

Referring to FIG. 9, it is shown an oscillating power circuit according to embodiments of the present invention, which is an oscillator. The pulse voltage-signal PP and the pulse voltage-signal Pn are inputted to the input port of the oscillating power circuit and provide a pulse oscillation-starting power supply signal. The pulse voltage-signal PP and the pulse voltage-signal Pn are converted to high-frequency charging signals by the oscillating power circuit 3, and the high-frequency charging signals at a frequency of 185 hz are outputted from the boost control port DC+/DC− respectively. Moreover, the pulse voltage-signal at a frequency of 185 hz is outputted in parallel from the oscillating power circuit to the frequency reduction circuit 4. The oscillating power circuit also comprises a testing port TST for input the test signal.

Figure 10:
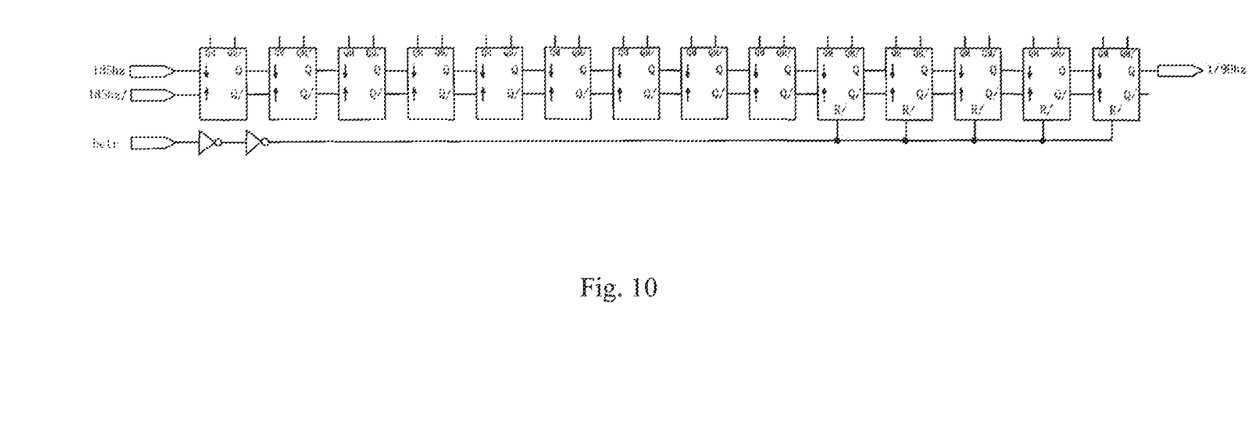
FIG. 10 illustrates a circuit schematic view of the frequency reduction circuit according to embodiments of the present invention.

As illustrated in FIG. 10, the frequency reduction circuit 4 is comprised of multipath latches connected in series. In an embodiment, 14 latches are used to constitute a chained frequency divider, and through which the 185 hz pulse voltage-signal is converted to a 1/90 hz square signal and then outputted to the low-frequency switching drive circuit 2.

As illustrated in FIG. 5, the high-frequency charging and discharging bootstrap circuit 1 comprises a rectifying circuit having two pairs of diode units D2A (including two diodes) and D2B (including two diodes), and charging and discharging capacitors C4, C5, and C8 connected with the diodes D2A and D2B, wherein the capacitor C4 is connected to the boost control port DC+ and the common terminal of D2A, and the capacitor C4 is connected to the boost control port DC+ and the common terminal of D2B. D2A connects to the VDD port at one end, and connects to one end of D2B and to the boost control port DC– via C8 at the other end, and the D2B connects to the VSS port at the other end. In this way, when the boost control port DC+/DC– output a high-frequency charging signal at a frequency of 185 hz, a 6.2V output voltage VLCD is outputted though the rectifying circuit and the charging and discharging capacitors. The entire circuit can be powered by simply using a button battery having a low voltage and a small volume due to the function of the high-frequency charging and discharging bootstrap circuit 1.

Figure 11:
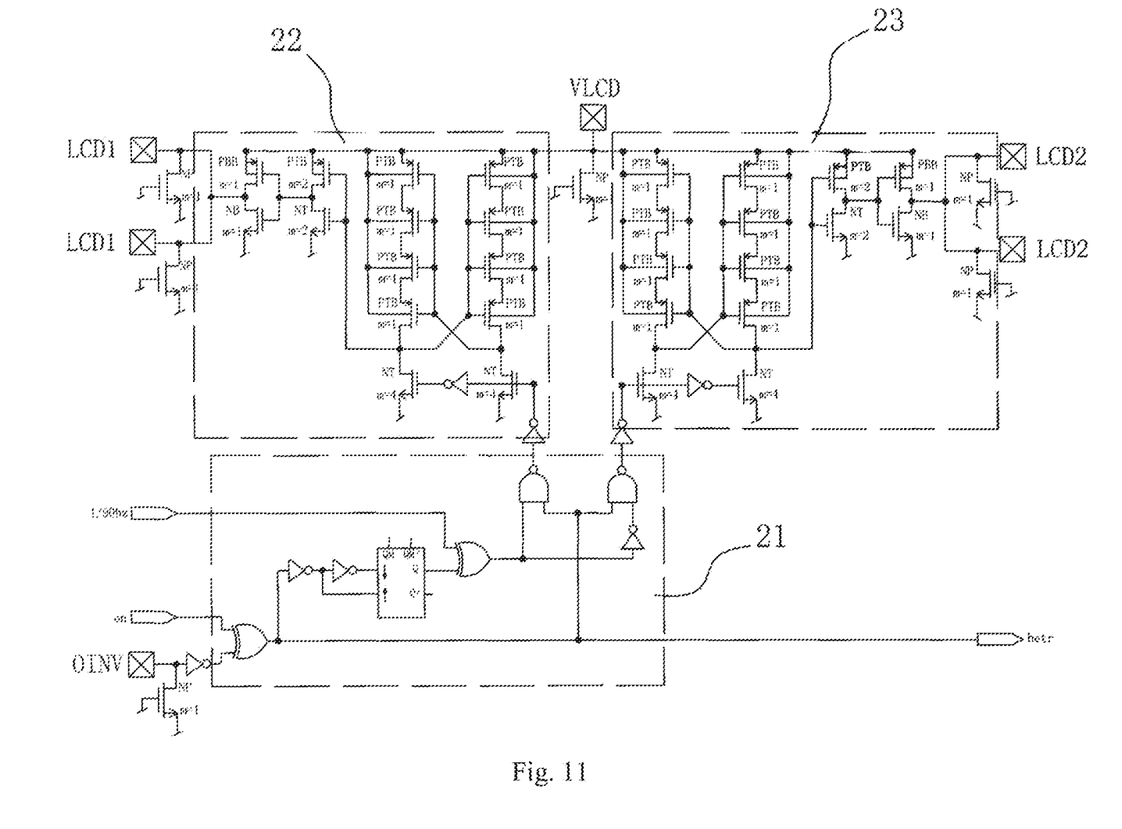
FIG. 11 illustrates a circuit schematic view of the low-frequency switching drive circuit according to embodiments of the present invention.

As illustrated in FIG. 11, the low-frequency switching drive circuit 2 comprises two analog switching circuits arranged symmetrically and a logic switching circuit 21, the output port of the high-frequency charging and discharging bootstrap circuit 1 is connected to the low-frequency switching drive circuit 2 via the VLCD port of the microprocessor 40, and is connected to the output port LCD1 and LCD2 of the low-frequency switching drive circuit 2 via the first analog switching circuit 22 and the second analog switching circuit 23 respectively. The LCD1 port is connected to a liquid crystal lens via LCDA+ port of the microprocessor 40, and LCD2 port is connected to a liquid crystal lens via LCDA– port of the microprocessor 40. The first 22 and second 23 analog switching circuits are controlled by the logic switching circuit 21 having two control output ports, one of which is used for controlling the first analog switching circuit 22 while the other for controlling the second analog switching circuit 23, the control signals from the two control ports are opposite so that the LCDA+ and LCDA– can output voltage control signals alternately.

The control ports of the logic switching circuit comprise a starting signal from the output port on of the time-delay circuit 7, and a square signal at a frequency of 1/90 hz from the frequency reduction circuit. As the logic switching circuit is under control of the two signals, when the logic switching circuit receives a starting signal from the output port on, it will be controlled by the square signal at a frequency of 1/90 hz, then the LCDA+ and LCDA– will output a signal at a frequency of 1/90 hz, so that the driving voltage of the liquid crystal lenses 50 is flipped every 90 seconds, which largely decreasing the frequency of the driving voltage of the liquid crystal lenses, thereby, an effectively reduced power consumption of the glasses as well as better power saving is achieved, and the life spans of the battery and the glasses are prolonged.

Figure 2:
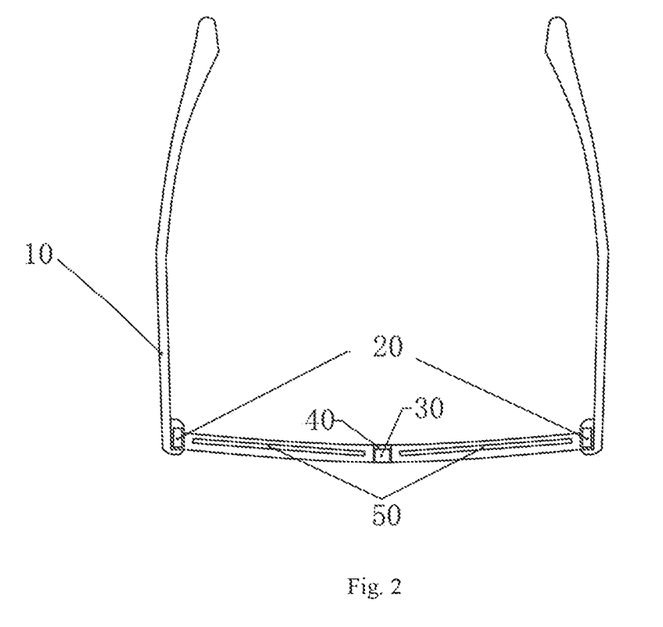
FIG. 2 illustrates a structural schematic view according to embodiments of the present invention.
Figure 3:
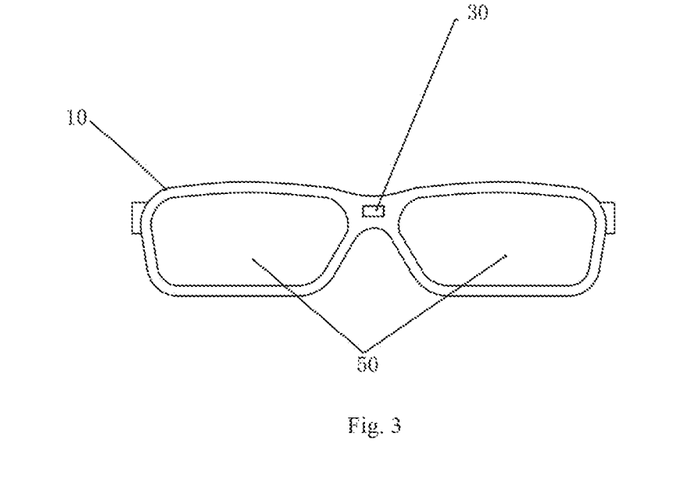
FIG. 3 illustrates a schematic view of the appearance according to embodiments of the present invention.

As illustrated in FIG. 2 and FIG. 3, the photosensor 30 and the microprocessor 40 are located at the nose pad of the spectacle frame 10, and the power supply module 20 is located at the nose pad or the legs of the spectacle frame 10. The appearance of the sunglasses with this configuration is improved as it minimizes the unwanted impact of circuit elements on the appearance.

Figure 4:
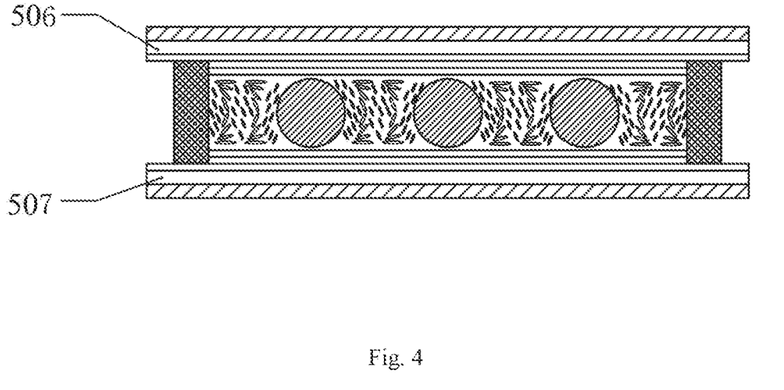
FIG. 4 illustrates a structural schematic view of the liquid crystal lenses according to embodiments of the present invention.

As illustrated in FIG. 4, the liquid crystal lenses comprise an upper glass substrate 506 and a lower glass substrate 507, the electrodes of which are connected to the output port of the low-frequency switching drive circuit 2 of the microprocessor respectively.

Although the present invention has been disclosed in the form of preferred embodiments and variations thereon, it will be understood that numerous additional modification and variations could be made thereto without departing from the scope of the invention.

For the sake of clarity, it is to be understood that the user of 'a' or 'an' throughout this application does not exclude a plurality, and 'comprising' does not exclude other steps or elements.

What is claimed is:

1. A pair of automatically photosensitive sunglasses with low power consumption, comprising a spectacle frame, two liquid crystal lenses provided on the spectacle frame, a power supply module, a photosensor for sensing an ambient luminosity, a microprocessor for adjusting the liquid crystal lenses between a bright condition and a dark condition, a high-frequency charging and discharging bootstrap circuit for increasing the output voltage, wherein the microprocessor comprises a input control port connected to the photosensor, a power source port connected to the power supply module, a boost control port connected to the input port of the high-frequency charging and discharging bootstrap circuit, and a low-frequency switching drive circuit for switching to a low or high driving voltage of the liquid crystal lenses; the low-frequency switching drive circuit has an input port connected to an output port of the high-frequency charging and discharging bootstrap circuit, and an output port connected to the two liquid crystal lenses.

2. The automatically photosensitive sunglasses with low power consumption according to claim 1, wherein the low-frequency switching drive circuit is installed internally in the microprocessor which further comprises an oscillating power circuit and a frequency reduction circuit; the oscillating power circuit provides a high-frequency charging signal to the high-frequency charging and discharging bootstrap circuit through the boost control port, and a low-frequency switching signal to the low-frequency switching drive circuit through the frequency reduction circuit.

3. The automatically photosensitive sunglasses with low power consumption according to claim 2, wherein the microprocessor further comprises a drive circuit of power supply for powering the interior of the microprocessor; the power supply module connects to the power source port and supplies a DC current; the drive circuit comprises a pulse power circuit having a pulse power output port connected to the oscillating power circuit, and the pulse power circuit converts the DC current from the power supply module to a pulse power signal and output it through the pulse power output port.

4. The automatically photosensitive sunglasses with low power consumption according to claim 3, wherein the pulse power circuit further comprises a biased current output port which is connected to the power supply port of the photosensor and used for providing a supply voltage to the photosensor.

5. The automatically photosensitive sunglasses with low power consumption according to claim 2, wherein the microprocessor further comprises a voltage detecting circuit for detecting a voltage across the photosensor, and the voltage detecting circuit has an the input port connected to the photosensor and an output port connected to the low-frequency switching drive circuit.

6. The automatically photosensitive sunglasses with low power consumption according to claim 5, wherein the voltage detecting circuit is connected with the low-frequency switching drive circuit via a time-delay circuit, and the voltage detecting circuit further comprises a delay control capacitor arranged outside the microprocessor and connected to the time-delay circuit.

7. The automatically photosensitive sunglasses with low power consumption according to claim 2, wherein the photosensor are located at a nose pad of the spectacle frame and the power supply module is located at the nose pad or legs of the spectacle frame.

8. The automatically photosensitive sunglasses with low power consumption according to claim 2, wherein a 1.55 V button battery is used in the power supply module for power supply, and the high-frequency charging and discharging bootstrap circuit output a voltage which is 4 times the battery voltage, namely 6.2 V.

9. The automatically photosensitive sunglasses with low power consumption according to claim 2, wherein the high-frequency charging signal provided by the oscillating circuit to the high-frequency charging and discharging bootstrap circuit has a frequency of 185 hz.

10. The automatically photosensitive sunglasses with low power consumption according to claim 2, wherein the low-frequency switching signal provided by the frequency reduction circuit to the low-frequency switching drive circuit is a square signal at a frequency of 1/90 hz.

\* \* \* \* \*